(12) United States Patent
Varghai et al.

(10) Patent No.: US 7,969,155 B2
(45) Date of Patent: Jun. 28, 2011

(54) DIRECTIONAL FAULT CURRENT INDICATOR

(75) Inventors: Mehri Varghai, Solon, OH (US); James Francis Domo, Chagrin Falls, OH (US)

(73) Assignee: Thomas & Betts International, Inc., Wilmington, DE (US)

( * ) Notice: Subject to any disclaimer, the term of this patent is extended or adjusted under 35 U.S.C. 154(b) by 444 days.

(21) Appl. No.: 12/164,049

(22) Filed: Jun. 28, 2008

(65) Prior Publication Data

US 2009/0009180 A1 Jan. 8, 2009

Related U.S. Application Data

(60) Provisional application No. 60/947,751, filed on Jul. 3, 2007.

(51) Int. Cl.
*G01R 31/08* (2006.01)
*G01R 25/00* (2006.01)

(52) U.S. Cl. .................................. 324/521; 324/76.77

(58) Field of Classification Search ................ 324/521, 324/512, 500, 555, 76.11, 76.77, 76.52, 617, 324/622, 86; 361/42, 44, 47, 244, 78, 85
See application file for complete search history.

(56) References Cited

U.S. PATENT DOCUMENTS

| | | | |
|---|---|---|---|
| 4,063,171 A | 12/1977 | Schweitzer, Jr. | |
| 4,092,691 A | 5/1978 | Williams | |
| 4,251,766 A | 2/1981 | Souillard | |
| 4,287,547 A | 9/1981 | Vitins | |
| 4,308,565 A | 12/1981 | de Mesmaeker et al. | |
| 4,317,151 A | 2/1982 | de Mesmaeker et al. | |
| 4,591,992 A | 5/1986 | Yamaura | |
| 4,618,933 A | 10/1986 | Vitins | |
| 4,645,940 A * | 2/1987 | Wertheim | 307/66 |
| 4,835,652 A | 5/1989 | Billings et al. | |
| 5,220,311 A | 6/1993 | Schweitzer, Jr. | |
| 5,255,148 A | 10/1993 | Yeh | |
| 5,399,974 A * | 3/1995 | Eriksson et al. | 324/521 |
| 5,572,138 A | 11/1996 | Nimmersj'o | |
| 5,796,259 A | 8/1998 | Dickmander | |
| 5,946,174 A * | 8/1999 | Kaiser | 361/47 |

(Continued)

FOREIGN PATENT DOCUMENTS

| | | |
|---|---|---|
| GB | 858213 B1 | 1/1961 |
| GB | 2004143 A | 3/1979 |

OTHER PUBLICATIONS

EPO Examination Report dated Jul. 29, 2009.

*Primary Examiner* — Hoai-An D Nguyen
(74) *Attorney, Agent, or Firm* — John DeAngelis, Esq.; Andrew Barger, Esq.; Beusse Wolter Sanks Mora & Maire, P.A.

(57) ABSTRACT

A method for identifying a fault condition associated with a power line conductor of an electrical power distribution network. The method determines if a load current carried by the conductor is above a minimum load current, determines a learned phase angle relationship between the load current and a source signal, determines a load current magnitude, determines a real-time phase angle relationship between the load current and the source signal and indicates a fault condition when the real-time phase angle relationship is within a predetermined number of angular degrees of the learned phase angle relationship and when the load current magnitude exceeds a fault-indicating current.

13 Claims, 5 Drawing Sheets

U.S. PATENT DOCUMENTS

| | | |
|---|---|---|
| 5,963,404 A | 10/1999 | Guzman-Casillas et al. |
| 6,130,531 A | 10/2000 | Hao |
| 6,525,543 B1 | 2/2003 | Roberts et al. |
| 6,584,417 B1 | 6/2003 | Hu et al. |
| 6,718,271 B1 | 4/2004 | Tobin |
| 6,987,389 B1 * | 1/2006 | Macbeth et al. ............... 324/536 |
| 7,023,196 B2 * | 4/2006 | Khan et al. .................... 324/521 |
| 7,023,691 B1 | 4/2006 | Feight et al. |
| 7,362,553 B2 * | 4/2008 | Elms et al. ..................... 361/42 |
| 2003/0184275 A1 | 10/2003 | Slade |

* cited by examiner

DIRECTIONAL FAULT CURRENT INDICATOR

REFERENCE TO RELATED APPLICATIONS

This application claims the benefit, under 35 U.S.C. 119 (e), of the provisional patent application entitled Directional Fault Circuit Indicator filed on Jul. 3, 2007 and assigned application Ser. No. 60/947,751.

FIELD OF THE INVENTION

This invention relates generally to the field of fault detection in electrical power distribution networks.

BACKGROUND OF THE INVENTION

The three power-supplying phase feeders (conductors) are monitored to detect electrical fault conditions on the distribution lines of an electrical power distribution network (grid). To clear or repair the faults, such as short circuits, it is important to first determine the fault location. In conventional overhead distribution systems there is a normal power flow direction, with power flow in the opposite direction (reverse power flow) only for contingency purposes. Reverse direction power flow is always known by the system operations staff and accounted for in systems operation and maintenance.

However, the fault location task is complicated in networked power distribution systems, such as urban and underground power distribution networks, because the direction of power flow through a particular line can change over time in response to load and source changes. Since power flow direction at any time is not known, it is problematic to use conventional non-directional fault indicators to determine fault location.

Other problems are encountered in detecting and locating faults in an underground network. Back fed current complicates fault detection and location. Network protector operation may be inconsistent and some protectors may not close after a fault has been repaired. This failed operation may leave segments of the network unenergized and unreported. The relatively short distance and attendant interference between conductors in the underground network also complicates fault detection.

Accordingly, an improved directional fault indicator apparatus for detecting a direction to a fault in an electrical power distribution network in the presence of typical power fluctuations and power flow direction changes is desired.

To shorten the time required to restore power on an underground network, the network includes splice points at known locations. Each splice point is an access point in a submersed or underground vault with about 1 to 11 three-phase primary feeders supplying power to the network at the splice point. Each splice point may also have access to a 120 VAC source that is independent of the electricity on the power-supplying phase conductors.

BRIEF DESCRIPTION OF THE DRAWINGS

Embodiments of the invention are explained in the following description in view of the drawings that show.

In accordance with common practice, the various described features are not drawn to scale, but are drawn to emphasize specific features relevant to the invention. Reference characters denote like elements throughout the figures and text.

DETAILED DESCRIPTION OF THE INVENTION

Figure 1:
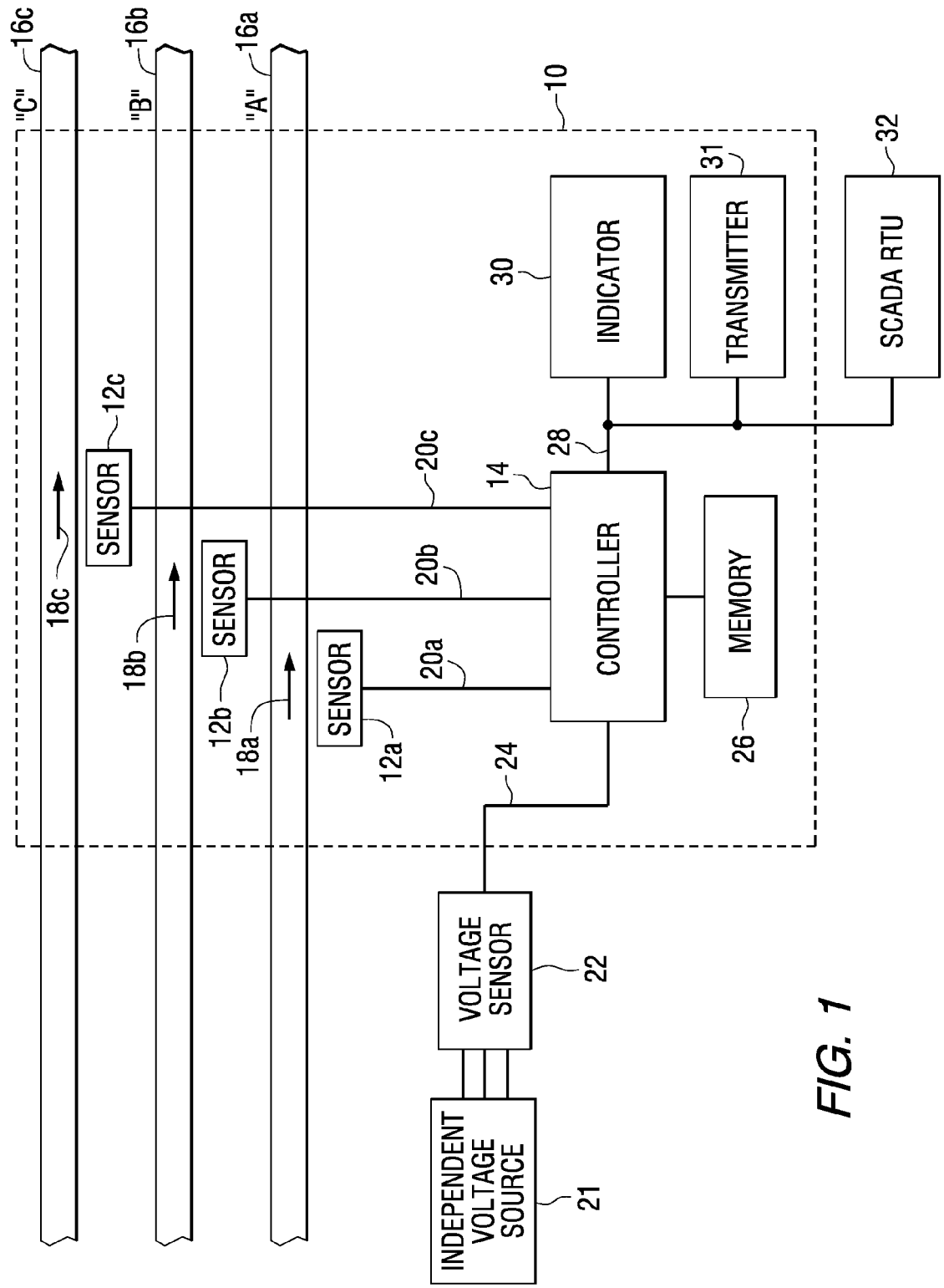
FIG. 1 is a block diagram illustrating an improved directional fault current indicator apparatus of the present invention.

Before describing in detail the particular method and apparatus related to a directional fault current indicator, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

The following embodiments are not intended to define limits as to the structure or method of the invention but only to provide exemplary constructions. The embodiments are permissive rather than mandatory and illustrative rather than exhaustive.

The directional fault current indicator of the present invention detects the occurrence of and direction to a fault on a power system grid (including a networked or a mesh power system grid), where the direction to the fault is relative to a sensing location of the fault current indicator. An approximate fault location is determined between a fault current indicator indicating a fault in a forward direction (where forward is in the direction of current flow) and a next immediate fault current indicator not indicating a fault in the forward direction. Thus the fault is located between the two fault current indicators.

Fault identification and fault direction determination according to the present invention require two conditions. First, a current magnitude must be above a pre-determined fault-indicating current magnitude. Second, a phase angle difference between a real-time load current and a real-time reference voltage must be within a prescribed angular range of a previously-determined (or learned) phase angle difference between the load current and the reference voltage.

The learned phase angle difference is determined during a steady-state current flow (i.e., a constant power flow direction for a minimum period) by determining a phase angle difference between a load current waveform and a reference voltage waveform and storing (learning) the phase angle difference. The phase angle difference is related to the direction of current flow (which may change when the phase angle difference is learned again later).

In one embodiment the prescribed angular range is about ±75 degrees. Learning the phase angle relationship and comparing the learned value with the real-time phase angle correctly identifies a fault direction and avoids false alarms (especially those due to back fed current).

The ability of the apparatus of the present invention to determine direction to a fault on an underground network is especially important. The fault current indicator apparatus is conventionally installed at a network splice point or any location where access to the underground distribution network can be conveniently gained. Use of the apparatus is not limited to a mesh distribution network, but can be advantageously employed on any distribution network. With the learned phase angle difference indicating steady-state current flow, when a fault occurs the direction of current flow or the phase relationship between the load current and the reference voltage may change at one or more of the fault current indicators of the present invention.

A direction to the fault is determined between a first directional fault current indicator apparatus indicating a fault in a forward direction (i.e., the fault is ahead (with respect to the direction of power flow) of the first apparatus) and a second apparatus not indicating a fault in the forward direction (i.e., the fault is behind the second apparatus). The real-time phase angle difference at the first apparatus will be within the prescribed angular range of the learned phase angle difference and thus indicative of a fault in the forward direction. The real-time phase angle difference at the second apparatus will be outside the prescribed angular range of the learned phase angle difference and thus ignored as not indicative of a fault in the forward direction.

The fault indicator can be installed at a splice point or network access point on each phase conductor, permitting fault detection on a specific phase conductor.

When a feeder providing power to a segment of the power grid is energized with a load current greater than a minimum load current (5 A in one embodiment, but selectable or programmable according to system operator specifications, load conditions and power system operating parameters) a settling period (2 seconds in one embodiment, but programmable or selectable according to system operator specifications, load conditions and power system operating parameters) is initiated. The settling period allows time for unwanted line transients and current surges due to the start-up of electrical devices to decay to zero or near zero. Current values below the minimum load current are generally too small to be considered valid load current and effectively indicate a no load condition; the learned phase angle difference is not determined under these conditions.

After the settling period has ended and the load current carried by the monitored phase conductor continues to equal or exceed the minimum load current, the fault current indicator of the present invention determines and stores (i.e., learns) the phase angle difference between the load current and the reference voltage. According to one embodiment, the reference voltage supplies power to operate the fault current indicator of the present invention.

The apparatus of the present invention also learns the phase angle difference whenever the minimum load current resumes after a loss of load current (i.e., where a loss of load current occurs when the load current falls below the minimum load current for a predetermined time). The apparatus initiates a settling period and after the settling period ends learns the phase angle difference. Generally, the predetermined time is selected to identify temporary fault conditions that do not result in load current direction flow changes that require relearning the phase angle difference. The apparatus also learns the phase angle difference whenever it is manually or automatically reset.

After having determined and stored the learned phase angle difference, during operation with steady-state current flow (about 300 A in one application, but in any case greater than the minimum load current) the indicator determines a real-time phase angle difference between the real-time current and the reference voltage. The indicator compares the real-time phase angle difference to the learned phase angle difference and determines whether the real-time phase angle difference is within a region bounded by the learned phase angle difference plus a predetermined value and the learned phase angle difference minus a predetermined value. In one embodiment the predetermined values are both about 75 degrees.

If the real-time phase angle difference is outside the bounded region (bounded by +75 degrees and −75 degrees from the learned phase angle difference when plotted on an x-y plane), then a back fed current (i.e., current in a reverse direction) is assumed and the condition ignored. Back fed current typically creates a phase angle difference of about 180 degrees. A real-time phase angle difference outside the ±75 degrees angular range may indicate that the power flow is from the other direction or from a different source.

If a fault occurs on phase conductor A interference from adjacent phase conductors B and C can create potential false alarms, especially if a substantial current (e.g., 4000 A) is carried on one of the phase conductors B and C. Setting the phase angle range at ±75 degrees minimizes the likelihood of a false alarm due to such interference conditions.

Generally, the angular range of ±75 degree provides enough margin to encompass all load conditions, fault impedances, line impedances and harmonic disturbances from adjacent phase conductors. The inventors of the present invention have determined that the angular range of about ±75 degrees provides a reliable indication of a forward fault downstream of the apparatus, whereas phase differences outside this range may be prone to erroneous indications and/or be indicative of a back fed condition. Recognizing that the currents carried by the three phase conductors are 120 degrees out of phase, the range of ±75 degree should provide acceptable adjacent phase conductor immunity, i.e., interference from proximate phase conductors. The range is also consistent with a steady-state power flow direction for normal faults. One will appreciate that other ranges (e.g., ±70 degrees to about ±80 degrees) may be useful in various applications. A range of ±75 degrees has been found to be advantageous for a particular underground urban power network as a result of the power flow variations experienced in this network.

If the real-time phase angle difference is within the range of ±75 degrees from the learned phase angle difference while a fault current is detected, then the apparatus of the present invention indicates a fault (referred to as an event) in the forward power flow direction.

The indicator apparatus of the present invention can be programmed or set to determine the learned phase angle difference at any desired time interval, in addition to determining the learned phase angle difference at start-up and upon entering the normal mode of operation. For example, the learned phase angle difference can be determined whenever the load current changes (with the exception of a change to a load current in excess of a fault-indicating load current).

Also, the indicator apparatus can be programmed or set to determine the real-time phase angle difference and compare that value with the learned phase angle difference continuously or at any desired interval. In one embodiment, the real time phase angle difference is determined and compared with the learned phase angle difference only when the load current exceeds a fault-indicating load current, e.g., 1200 A according to one embodiment.

Figure 5:
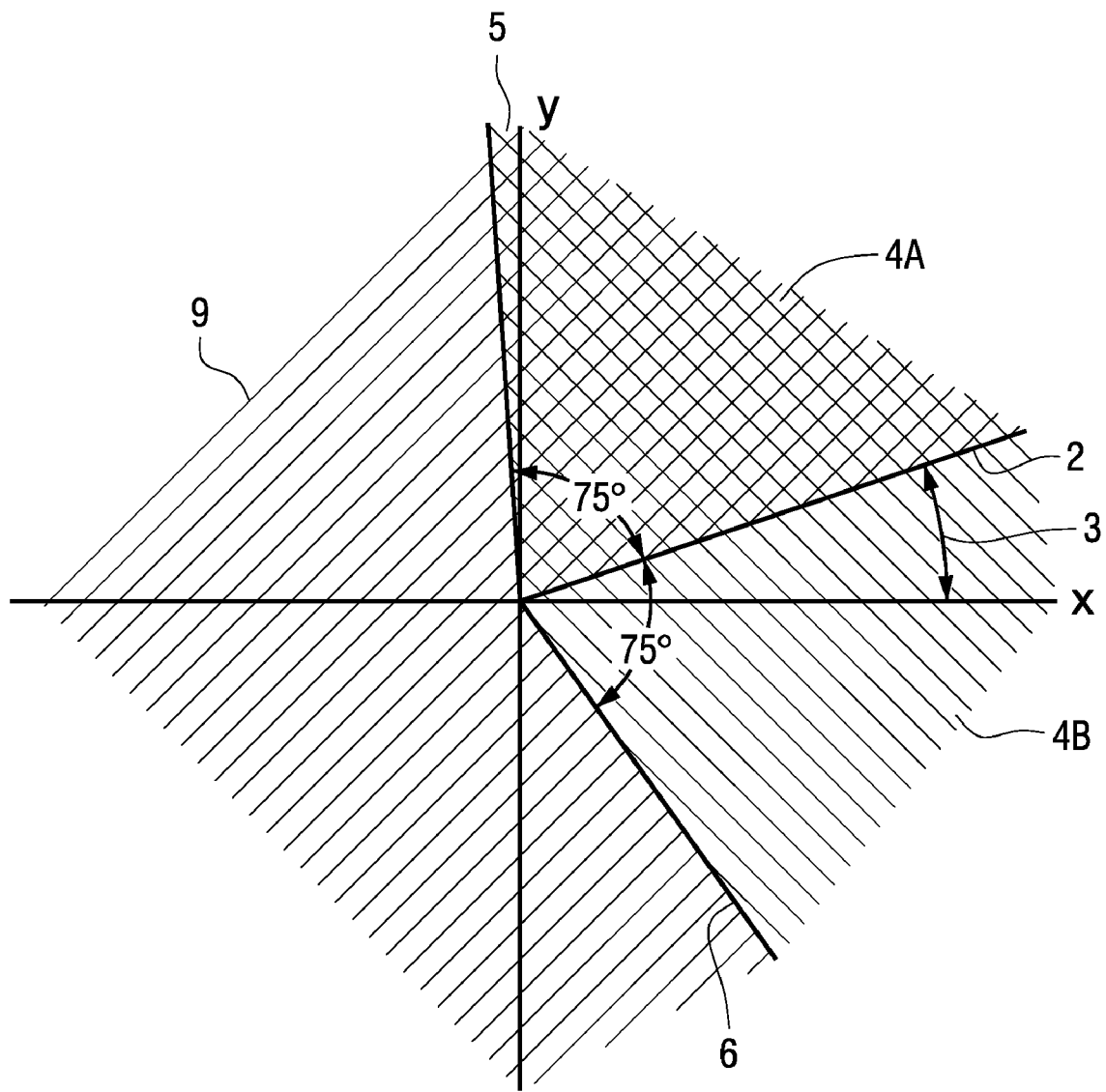
FIG. 5 is a phase angle representation on an x-y plane for use with the directional fault current indicator apparatus of FIG. 1.

FIG. 5 illustrates a line 2 that represents a learned phase angle difference 3 on an x-y plane where the x axis represents a 0 degree (or 360 degree) phase angle and the y-axis represents a 90 degree phase angle. A region 4A extends from the line 2 to a line 5; the line 5 representing the learned phase angle difference 3 plus 75 degrees. A region 4B extends from the line 2 to a line 6; the line 6 representing the learned phase angle difference 3 minus 75 degrees. Thus the regions 4A and 4B bound a region of ±75 degrees from the learned phase angle difference 3. Real-time phase angles within the region 4A or 4B indicate a possible fault on the monitored phase conductor as determined by the directional fault current indicator of the present invention. Stated differently, when the real-time phase angle difference is within 75 degrees (i.e., ±75 degrees) of the learned phase angle difference a possible fault is indicated.

A region 9 extends counterclockwise from the line 5 to the line 6. Phase angles within the region 9 are ignored as indicative of a back fed (reverse) current flow.

With reference to FIG. 1, a directional fault current indicator apparatus 10 includes at least one sensor 12a and a controller 14 coupled to the sensor 12a. The sensor 12a may be configured for sensing an electrical condition (e.g., current or voltage) of a conductor. For example, the conductor may include a first conductor 16a, also referred to as conductor "A" in FIG. 1, in a three phase power distribution scheme. Conductors 16b and 16c, designated "B" and "C" in FIG. 1, may conduct second and third phase currents, respectively. In an exemplary embodiment, sensor 12a may be configured for sensing a current waveform indicative of a current 18a flowing in conductor 16a and for generating a current signal 20a indicative of the current waveform.

The apparatus 10 may include additional sensors 12b and 12c for sensing electrical conditions of other conductors, such as respective conductors 16b and 16c of the illustrated three-phase power distribution network. Sensors 12b and 12c may be configured, for example, for sensing current waveforms indicative of currents 18b and 18c flowing in respective conductors 16b and 16c and for generating respective current signals 20b and 20c indicative of the respective current waveform. The signals 20b and 20c are input to the controller 14.

In one embodiment the sensors 12a, 12b and 12c comprise current transformers. Alternatively, the sensors 12a, 12b and 12c comprise other current sensing devices providing waveform (including amplitude) information of the currents carried over the respective three phase conductors 16a, 16b and 16c.

The controller 14 is also responsive to information representing a voltage waveform from an independent voltage source 21 via a voltage sensor 22. Although illustrated as independent from the voltage on the conductors 16a, 16b and 16c, in another embodiment the voltage from the voltage source 21 may be derived from the voltage on one or more of the conductors 16a, 16b and 16c. In one embodiment the monitored voltage may be an AC voltage (for example, 120 VAC) independent of the voltages carried on the three phase conductors A, B and C. It is noted that only the difference between the learned (i.e., no fault condition) phase angle difference (i.e., the difference between the phase angle of the reference voltage and the phase angle of the sensed current) and the real-time or monitored phase angle difference determines the existence of a fault as indicated by the apparatus of the present invention. Therefor it is not required that the reference voltage be related to the voltage on one or more of the phase conductors A, B and C or that the reference voltage have a magnitude of 120 VAC. In an exemplary embodiment, the sensor 22 may include a potential transformer for providing a signal 24 representative of the voltage waveform of the voltage source 21.

Start-up of an inductive load on the conductors 16a, 16b and 16c, for example, may change the real-time phase angle difference. However, the selected angular range around the learned/stored phase angle difference takes into account such changes and permits the directional fault current indicator to more accurately determine the direction of a fault.

The controller 14 is configurable in a first operational mode for determining and storing (learning) the phase relationship between the voltage sensed by the voltage sensor 22 and the load current sensed by one (or more) of the sensors 12a, 12b and 12c.

The controller 14 is configurable to a second mode for monitoring the real time phase angle difference (also referred to as the monitored phase angle difference) between the reference voltage and the load current. The relationship between the real-time phase angle difference and the learned phase angle difference, in conjunction with detecting a fault-indicating current, may be indicative of a network fault and allow the apparatus of the present invention to determine a direction to the fault.

In both the first and second operational modes, the controller 14 processes at least one of the signals 20a, 20b and 20c (representing a current) and the signal 24 (representing a voltage) to determine the phase relationship and from that value determines whether a potential fault condition exists on one or more of the conductors 16a, 16b and 16c. The frequency at which the controller 14 operates in the second or monitoring mode or the conditions that cause the controller 14 to operate in the second mode can be programmable or selectable by the system operator.

The controller 14 may be embodied in the form of a processor or computer operating on executable instructions, a digital or analog control system or another device for receiving input signals or data, processing the data, executing instructions and producing appropriate output signals. The controller 14 may be configured with appropriate control modules and databases to execute the various aspects of the invention.

In other embodiments of the invention it may be desired to also determine fault conditions on the B and/or C phase conductors. A different phase relationship may therefore be learned for each phase A, B and C, reflecting the phase differences between the current carried on the phase conductors A, B and C. In such embodiments it is necessary to determine the learned phase angle difference between the current on the B and/or C phase conductors and the reference voltage. Such embodiments require use of two additional fault indicators of the present invention or a single fault indicator having the capability to monitor the learned and real-time phase angle differences on all three of the phase conductors.

Figure 2:
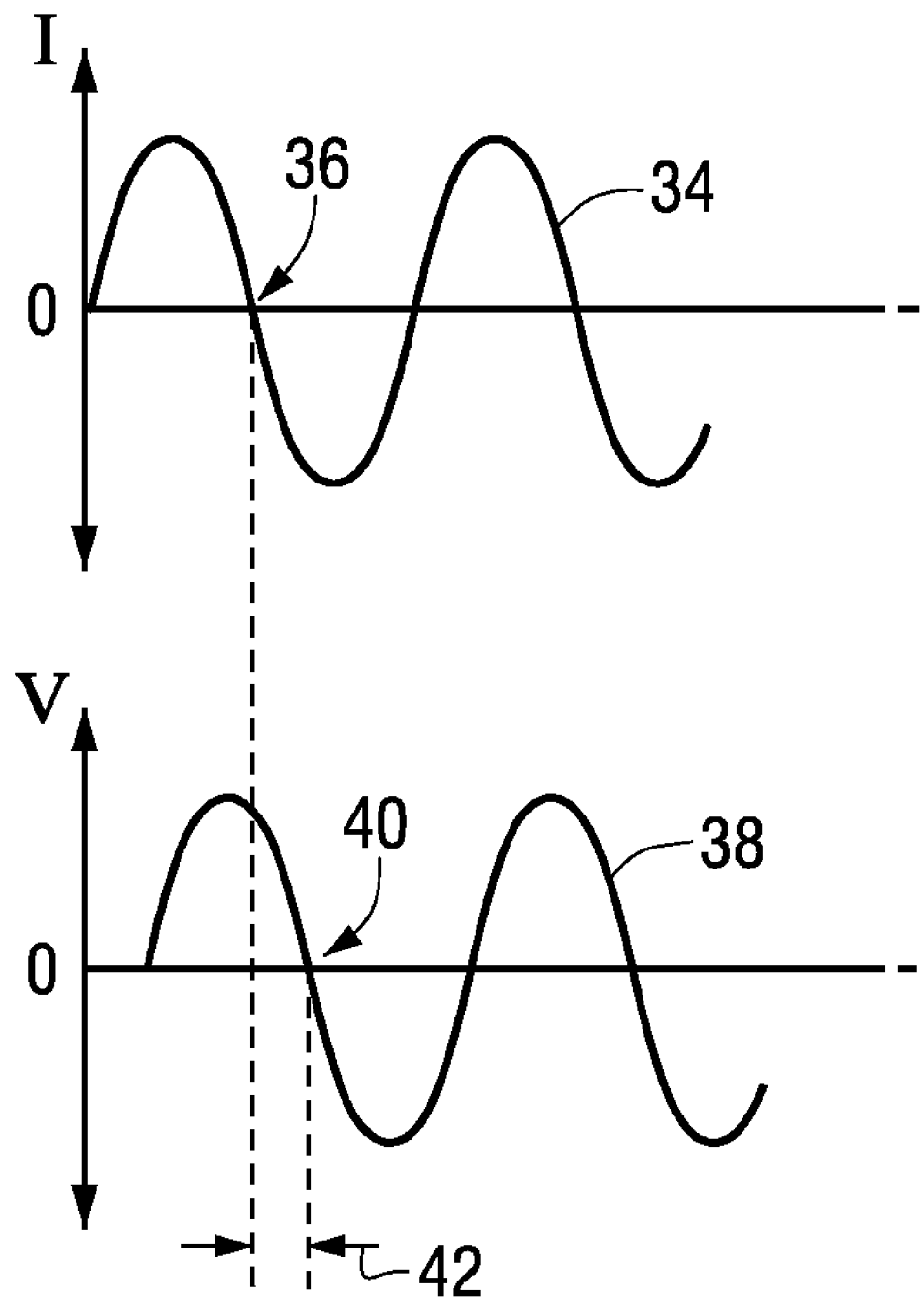
FIG. 2 shows a representative voltage waveform and a representative current waveform for determining a phase relationship between the voltage and current waveforms.

In an exemplary embodiment, the controller 14 may be configured to determine a phase relationship between at least one of the current signals 20a, 20b and 20c and the voltage signal 24 from the voltage sensor 22. For example, as shown in FIG. 2, the controller 14 may be configured in the first or learning mode to identify a zero crossing 36 of a current waveform 34 (represented by a signal 20a), to identify a zero crossing 40 of a voltage waveform 38 and to determine a learned phase difference 42 between the zero crossings 36 and 40. The learned phase difference 42 may be stored in a memory 26 (see FIG. 1) accessible by the controller 14. In an exemplary embodiment, the learned phase angle difference stored in the memory 26 may be updated in real-time or near real-time.

After determining and storing the learned phase angle difference 42, the controller 14 may enter the second or monitoring mode to monitor the current continuously or periodically (but typically relatively frequently) to determine a phase difference between the signal 24 from the voltage sensor 22 and a monitored current (signals 20a, 20b or 20c) to determine whether the real-time difference between the two signals is different from the learned phase difference and the magnitude of that difference.

In addition, the controller 14 may also determine a magnitude of the monitored phase current, such as by calculating an RMS current value based on the current waveform 34, to determine the existence of a fault-indicating current. The determined current magnitude may be used to distinguish between normal current levels and abnormal (fault) current levels indicative of fault conditions.

For the apparatus of the present invention to indicate a fault, the difference between the learned phase angle relationship and the monitored or real-time phase angle relationship must be within a prescribed angular range and the determined current magnitude must exceed the fault-indicating current value, such as 1200 A in one embodiment, representative of a fault current. The utility system operator typically establishes the fault-indicating current based on load conditions and other system operating parameters.

In another embodiment, characteristics of a sensed current waveform over certain time periods may be used to identify a fault condition. For example, a rate of current increase, such as an increase of about 100 amperes or greater, over a predetermined time period, such as about 50 milliseconds, may be used to identify a potential fault. If such a current characteristic is followed by a reduction of current below a minimum level, such as 5 amperes, within another predetermined time period, such as about 60 seconds, then a fault condition may be declared. The phase angle difference is not considered in this embodiment.

Returning to FIG. 1, the controller 14 may also supply an indication signal 28 for operating an indicator 30 to signal a fault condition. The indicator 30 may comprise a light, such as a flashing LED (flashing at about 30 flashes per minute to indicate a fault), another visual indicator or an audio indicator. The indicator 30 may be disposed proximate the controller 14 and/or sensors 12a, 12b, 12c or at a related site, such as a centralized maintenance or service center for alerting appropriate maintenance personnel of the existence of the fault and the need for possible repair of the fault.

In another embodiment, the indication signal 28 may be provided to a supervisory control and data acquisition (SCADA) system associated within the power network via a remote terminal SCADA (RTU) 32. In such an embodiment, the controller 14 closes SCADA contacts to indicate the fault and initiate remote monitoring.

In still another embodiment, a wireless transmitter 31, such as a radio frequency or infrared transmitter, transmits the indication signal 28 to a remote receiver (not shown), such as a remote receiver at a centralized maintenance or service center for alerting appropriate maintenance personnel to the need for servicing the fault. Alternatively, the message may be transmitted from the transmitter 31 to a mobile, portable or cellular telephone or to a messaging system.

The indicator 30 may also be configured to display, responsive to the indication signal 28, indicia indicative of a mode of operation of the apparatus 10, such as during the learning mode when the learned phase relationship is determined. For example, a blinking period and/or frequency of an LED may be used to indicate various operating modes or network conditions.

Figure 3:
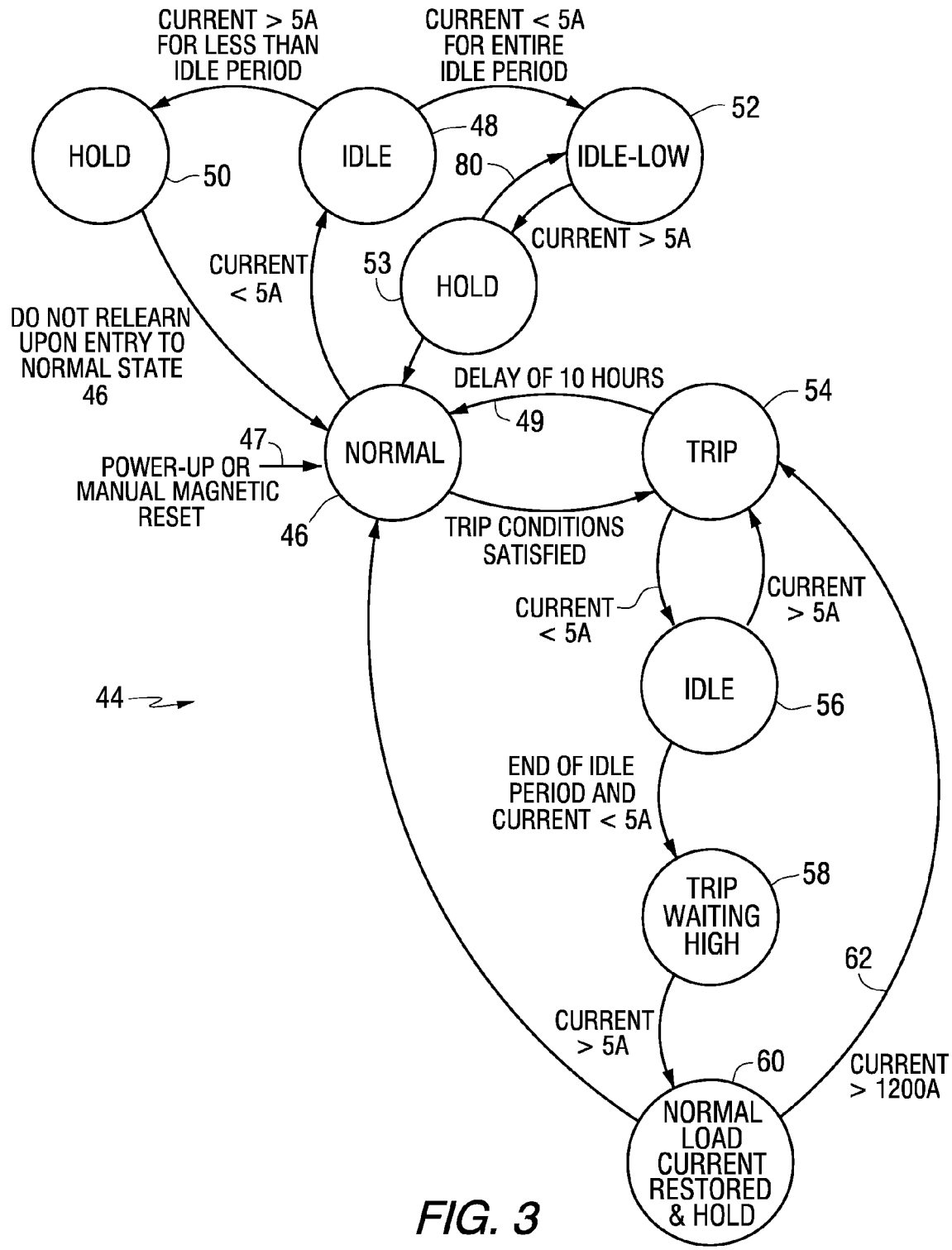
FIG. 3 is a state diagram illustrating an operational example of the directional fault current indicator apparatus of FIG. 1.

FIG. 3 is a state diagram 44 illustrating an exemplary operation of the apparatus 10 of FIG. 1 for performing the above described methods. Generally, logic embodying the FIG. 3 (and FIG. 4) state diagram interprets a brief loss of load current (a loss of less than about 5 minutes in one embodiment and a load current of less than about 5 A in one embodiment) differently than a longer outage (more than about 5 minutes in one embodiment). The latter situation indicates a sustained (permanent) fault requiring a repair and an extended fault indication period (i.e., an indication provided by the fault current indicator of the present invention).

Upon initialization of the apparatus 10, the controller 14 enters a normal operational state 46. As illustrated by an arrowhead 47, the controller 14 may be initialized at a power-up of the apparatus 10 when voltage is applied to the apparatus 10 or by operation of a manual reset, such as a magnetically activated manual reset, following clearing of a fault condition. In the latter case, a technician manually resets (and thereby initializes) the apparatus 10 using a magnetic reset device or magnet. Specifically, the technician holds the reset device proximate a reset label on the device for about one second. In one embodiment, an LED on the apparatus illuminates to indicate a reset condition. Other embodiments comprise different reset indications.

The apparatus can also enter the normal state 46 after expiration of a predetermined time period from identification of a fault condition, as indicated by an arrowhead 49 from a trip state 54 to the normal state 46. The predetermined time period is about ten hours in one embodiment. Generally, the learned phase angle difference is relearned when the normal state is entered.

If the fault condition is not repaired within the allotted time, when the apparatus returns to the normal state 46 the fault is again indicated and returns to the trip state 54

Upon entering the normal state 46 the apparatus 10 senses a current, for example, current 18a in a conductor 16a of FIG. 1. If the current is above the predetermined minimum load current, the apparatus learns the phase angle difference as explained herein. Generally before learning the phase angle difference, the controller allows any initial transient conditions to decay to zero or near zero without any indications of a fault condition.

If the load current is below the minimum load current, learning the phase angle difference does not occur and the controller 14 moves from the normal state 46 to an idle state 48. It should be understood that the predetermined minimum current may be established based on system operator requirements and/or network operating parameters and may be adjusted after installation of the apparatus. In the illustrated embodiment the predetermined minimum load current is about 5 A.

If while in the idle state 48 the current remains below the predetermined minimum current for the entire idle period, such as about 5 minutes in one embodiment, the controller 14 enters an idle low state 52. During the idle periods of the idle state 48 and the idle low state 52, the apparatus 10 ignores any unstable load conditions that might be due to start up, repair of the network or adding or removing feeders or loads from the network.

At predetermined intervals, the apparatus 10 determines the load current and remains within the idle low state 52 if the load current is below the minimum load current. While the current remains below the predetermined minimum load current, it is not necessary to activate the apparatus of the present invention.

While in the idle low state 52, if the load current increases above the minimum load current value, the controller 14 enters a hold (or stabilization) state 53. If the current continuously exceeds the minimum load current for a hold period (5 minutes in one embodiment), the controller 14 exits the hold state 53 and enters the normal state 46. If the current does not exceed the minimum load current for the entire hold period, the controller 14 returns to the idle-low state 52 over a path 80.

Upon entering the normal state 46, the controller 14 learns the phase angle relationship between the sensed current and the reference voltage. Note that a stabilization period is typically not required when entering the normal state 46 from the hold state 53 because of the hold period associated with the hold state 53.

Returning to the idle state 48, if the current increases to a value greater than the minimum load current value at any time during the idle state 48, the controller 14 moves to an idle high state 50. The state 50 includes a predetermined stabilization period (in one embodiment about 2 seconds) to allow transient currents caused by in-rush current of motor starters, for example, to decay. After the stabilization period the controller 14 enters the normal state 46. But at this entry path the phase angle difference between the sensed current and the reference voltage is not learned upon entry to the normal state 46. Since the load current was lost for only a brief transient period, the apparatus assumes that no event occurred to cause a load current direction flow that would require relearning. For example, a drop in the load current below 5 A for less than five minutes may have been caused by a load startup transient, for example.

As described above, generally upon entering the normal state 46 the phase angle difference is learned. After learning the phase angle difference, the controller monitors the load current on a phase conductor, such as the phase conductor 16a, for example. If the monitored current exceeds a predetermined fault-indicating current magnitude, such as about 1200 amperes, and a real-time monitored phase angle (the phase angle between the load current and the reference voltage) is within plus or minus 75 degrees of the learned phase angle, the controller 14 enters a trip state 54 indicative of a fault condition in the forward direction. The apparatus 10 of the present invention generally does not trip circuit breakers to isolate the fault, but instead provides a fault indication. Those skilled in the art recognize that the fault-indicating current magnitude may be established based on system operator set up of the directional fault current indicator and/or may be adjusted at a later time, such as after installation of the apparatus.

While the controller 14 is in the trip state 54, if the level of the sensed current drops below the predetermined minimum load current this condition may indicate that the load current has been removed to repair the fault or a recloser has opened to try to clear the fault. Responsive to the load current dropping below the minimum load current, the controller 14 enters an idle state 56, which in one embodiment has a duration of about five minutes.

If the current remains below the minimum load current throughout the period of the idle state 56, (e.g., due to recloser activity), the controller 14 enters a trip waiting high state 58 (i.e., the apparatus is still in a trip condition but waiting for a high current (a current greater than the minimum load current)).

If at anytime during the duration of the idle state 56 the current exceeds the minimum load current, the controller 14 returns to the trip state 54.

When in the trip waiting high state 58, if the apparatus senses a higher current indicative of a load condition, such as a current magnitude greater than the minimum load current, the controller moves to a normal load current restored and hold state 60.

If the current remains greater than the minimum load current for the hold period associated with the state 60 (also referred to as a settling period), the controller 14 returns to the normal state 46. In one embodiment the hold or settling period is about 15 minutes. Upon entering the normal state 46, the apparatus relearns the phase relationship.

When in the state 60, if at anytime the current exceeds the fault-indicating current magnitude, the controller 14 returns to the trip state 54 via a transition path 62.

The apparatus remains in the trip state 54 unless the load current drops below the minimum load current, causing the controller 14 to transition to the idle state 56. When the fault occurs a reset period is initiated (for example, a timer is started). At the end of the reset period, the controller 14 automatically resets the apparatus to remove the trip condition indication. The reset time is programmable and in one embodiment is about 10 hours. Also at the end of the reset period the apparatus returns to the normal state 46 over the path 49 and relearns the phase angle between the load current and the reference voltage.

In the event the fault is not cleared or repaired within the ten hour period, upon expiration of that period and return to the normal state 46, the fault is again detected and indicated. The controller 14 returns to the trip state 54.

If the fault condition has been cleared or repaired before the fault reset period has ended, the apparatus can be manually reset by the magnetic resetting process as described above.

Figure 4:
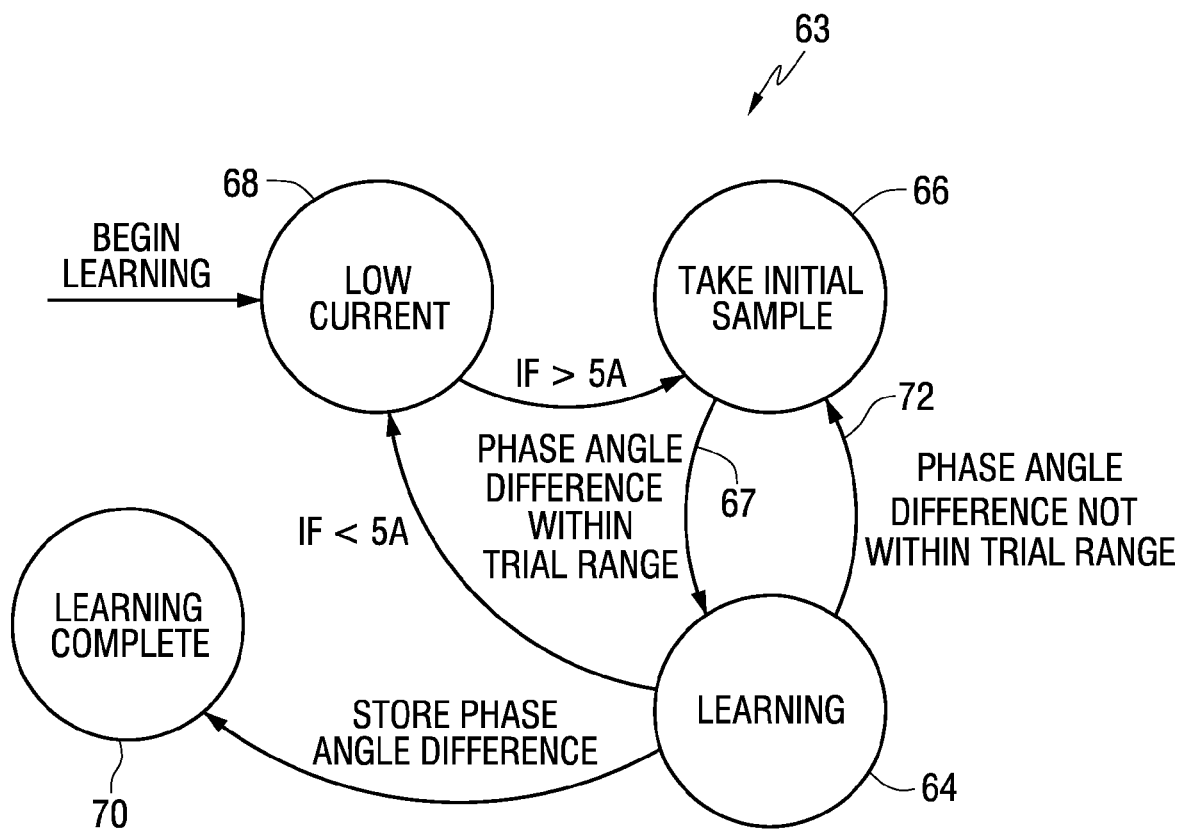
FIG. 4 is a state diagram illustrating a phase angle relationship learning mode of the directional fault current indicator apparatus of FIG. 1.

FIG. 4 is a state diagram 63 illustrating an exemplary phase relationship learning mode operation of the apparatus 10 of FIG. 1. In one embodiment, the learning mode is self-initiated in response to certain sensed conditions and/or in response to an initialization procedure, such as a reset, as described above. FIG. 3 depicts the various state transitions that return operation to the normal state 46; in most cases, at the beginning of the normal state 46 the apparatus learns or relearns the phase relationship between the load current and the reference voltage.

To begin learning, the controller 14 may initially enter and remain in a low current state 68 until the current exceeds the minimum load current, such as 5 A. When the current magnitude exceeds this value, the controller 14 may enter a take-initial-sample state 66 for determining if a phase angle difference between a phase angle of the sensed current and a phase angle of the reference voltage is within a predetermined trial phase angle difference range. In one embodiment the trial phase angle range is about 10 degrees. The trial range can be adjusted by the system operator to reflect network operational parameters. When the phase angle difference is within the predetermined trial range, the controller 14 enters a learning state 64 via a path 67. If during the learning state 64 (about 2 seconds in one embodiment) the phase difference remains within the trial phase angle difference range, then the controller 14 stores the phase angle difference and enters the learning complete state 70.

While in the learning state 64, if the phase angle difference between a phase angle of the sensed current and the phase angle of the reference voltage exceeds the trial phase angle difference range then the controller returns to the take-initial-sample state 66 via a path 72.

While in the learning state 64, if the load current falls below the minimum load current (e.g., 5 A in one embodiment), the controller returns to the low current state 68.

In network power systems repairing the fault may take days and therefore until the fault is repaired the system operator may route current from a different source. This source may result in current flow that is in a reverse direction from the pre-fault current flow. The apparatus of the present invention obviates this scenario by learning the phase angle difference between the load current and the reference voltage and employing this phase angle difference in determining whether to indicate a fault.

The various time intervals (e.g., hold time, settling time, reset time, idle time) set forth above are merely exemplary as determined by a specific power system network. These times are alterable by the network operator or by the manufacturer to suit the parameters of a specific network. Thus these time intervals may be different in other embodiments of the invention.

While various embodiments have been shown and described herein, it will be obvious that such embodiments are provided by way of example only. For example, it is envisioned that the directional fault indicator described herein may be used in both underground and overheard electrical power distribution networks. Numerous variations, changes and substitutions may be made such as changing the time periods or current magnitude values from those set forth above.

What is claimed is:

1. A method for identifying a fault condition associated with a power line conductor of an electrical power distribution network, the method comprising:
   determining a load current carried by the conductor is above a minimum load current value;
   determining a learned phase angle relationship between the load current and a source signal;
   storing the learned phase angle relationship;
   determining a real-time phase angle relationship between the load current and the source signal by determining if the load current drops below the minimum load current value continuously for a first time period and then increases above the minimum load current value, initiating a second time period and determining the real-time phase angle relationship between the load current and the source signal after the second time period has ended and
   indicating a fault condition when the real-time phase angle relationship is within a predetermined number of angular degrees of the learned phase angle relationship and when the load current exceeds a fault-indicating current value.

2. The method of claim 1 wherein the first time period and the second time period are independently selectable.

3. The method of claim 1 wherein the first time period is about 5 minutes and the second time period is about 15 minutes.

4. The method of claim 1 wherein the step of determining the learned phase angle relationship between the load current and the source signal further comprises:
   determining an initial value of the learned phase angle relationship:
   if the initial value is within a trial phase angle range, entering a learning state;
   if during a duration of the learning state the initial value remains within the trial phase angle range, storing the initial value as the learned phase angle relationship between the load current and the source signal; and
   if during the duration of the learning state the initial value is not within the trial phase angle range, returning to the step of determining the initial value of the learned phase angle relationship.

5. The method of claim 4 wherein the duration of the learning state is about two seconds.

6. The method of claim 1 wherein a trip state is associated with the step of indicating the fault condition, and wherein the step of indicating the fault condition further comprises:
   entering an idle state responsive to the load current dropping below the minimum load current value;
   from the idle state, entering a trip waiting high state if the current remains below the minimum load current value throughout a first idle period associated with the idle state;
   from the idle state, returning to the trip state if the current rises above the minimum load current value during the idle period; and
   from the trip waiting high state, if the load current exceeds the minimum load current value, holding for a second period and then determining the learned phase angle relationship, after which the steps of determining the real-time phase angle relationship, determining the phase angle difference and indicating a fault condition are executed.

7. A method for monitoring a power line conductor of an electrical power distribution network, the method comprising:
   determining a load current carried by the conductor is above a minimum load current value;
   determining a learned phase angle relationship between the load current and a source signal;
   entering a normal state after determining the learned phase angle relationship;
   while in the normal state, if the load current falls below the minimum load current value:
      entering a first idle period;
      if during the first idle period the load current increases to a value greater than the minimum load current value, waiting a stabilization period and returning to the normal state;
      if the current is below the minimum load current value throughout the first idle period;
         entering a second idle period until the load current increases above the minimum load current value;
         delaying a first delay period after the load current increases above the minimum load current value;
         returning to the step of determining the learned phase angle relationship after the first delay period; and
   returning to the normal state after determining the learned phase angle relationship.

8. The method of claim 7 wherein the minimum load current value, a duration of the first idle period, a duration of the second idle period and a duration of the first delay period are each independently determined responsive to operating parameters of the electrical power distribution network.

9. The method of claim 7 wherein the source signal comprises an AC voltage.

10. The method of claim 7 wherein the normal state further comprises:
    determining a load current magnitude;
    determining a real-time phase angle relationship between the load current and the source signal;
    and wherein a trip state comprises:
       indicating a fault condition when the real-time phase angle relationship is within a number of angular degrees of the learned phase angle relationship and when the load current magnitude exceeds a fault-indicating current.

11. The method of claim 10 further comprising a step of automatically resetting to the normal state after a second delay period following the step of indicating a fault indication.

12. The method of claim 10 wherein the number of angular degrees is about ±75 degrees.

13. The method of claim 10 wherein the step of indicating a fault condition further comprises one or both of illuminating an indicator and closing SCADA contacts.

* * * * *